(12) United States Patent
Xu et al.

(10) Patent No.: US 10,332,899 B2
(45) Date of Patent: Jun. 25, 2019

(54) 3D PACKAGE HAVING EDGE-ALIGNED DIE STACK WITH DIRECT INTER-DIE WIRE CONNECTIONS

(71) Applicant: Intel Corporation, Santa Clara, CA (US)

(72) Inventors: Yi Xu, Folsom, CA (US); Florence Pon, Folsom, CA (US); Yong She, Songjiang (CN)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/721,703

(22) Filed: Sep. 29, 2017

(65) Prior Publication Data
US 2019/0103409 A1    Apr. 4, 2019

(51) Int. Cl.
| | |
|---|---|
| *H01L 27/112* | (2006.01) |
| *G06F 17/50* | (2006.01) |
| *H01L 21/768* | (2006.01) |
| *H01L 23/525* | (2006.01) |
| *H03K 19/177* | (2006.01) |

(52) U.S. Cl.
CPC ........ *H01L 27/1128* (2013.01); *G06F 17/505* (2013.01); *G06F 17/5068* (2013.01); *H01L 21/768* (2013.01); *H01L 23/5252* (2013.01); *H01L 27/11206* (2013.01); *H03K 19/1778* (2013.01); *H03K 19/17736* (2013.01); *H03K 19/17748* (2013.01); *H01L 2224/73204* (2013.01); *H01L 2224/73265* (2013.01)

(58) Field of Classification Search
None
See application file for complete search history.

(56) References Cited

U.S. PATENT DOCUMENTS

| | | | |
|---|---|---|---|
| 9,627,358 B2* | 4/2017 | Zhao | H01L 25/00 |
| 9,679,873 B2* | 6/2017 | Keser | H01L 21/31116 |
| 2009/0127702 A1* | 5/2009 | Dekker | H01L 21/486 |
| | | | 257/713 |
| 2010/0314740 A1 | 12/2010 | Choi et al. | |
| 2011/0062596 A1 | 3/2011 | Murayama et al. | |
| 2012/0133381 A1* | 5/2012 | Bruland | H01L 22/32 |
| | | | 324/754.03 |
| 2015/0001739 A1* | 1/2015 | Chiu | H01L 21/82 |
| | | | 257/782 |
| 2016/0161992 A1* | 6/2016 | Kwon | H01L 23/48 |
| | | | 361/679.31 |

OTHER PUBLICATIONS

Extended European Search Report for European Patnet Application No. 18191337.7, dated Nov. 30, 2018.

* cited by examiner

*Primary Examiner* — Seokjin Kim
(74) *Attorney, Agent, or Firm* — Green, Howard & Mughal LLP.

(57) ABSTRACT

An IC package, comprising a substrate and two or more vertically stacked dies disposed within the substrate, wherein all the edges of the two or more dies are aligned with respect to one another, wherein at least two dies of the two or more vertically stacked dies are coupled directly to one another by at least one wire bonded to the ones of the at least two dies.

11 Claims, 7 Drawing Sheets

US 10,332,899 B2

3D PACKAGE HAVING EDGE-ALIGNED DIE STACK WITH DIRECT INTER-DIE WIRE CONNECTIONS

BACKGROUND

In modern Integrated Circuit (IC) packaging, multiple dies may be stacked to allow higher levels of integration without increasing the package footprint. The technology is known as three dimensional (3D) vertical packaging, and may involve flip-chip technology or wire bonding of dies in a vertical arrangement. Wire bonding for die interconnection is mostly used over flip-chip technologies for lower signal bandwidth applications, as the infrastructure for flip-chip technology is generally more expensive and complex than wire bonding. One challenge of wire bonding for 3D packaging of dies having the same size is the need to route the interconnecting wires from the individual dies to the substrate and back to the next die when the dies are stacked in a straight-up configuration, that is, when the die edges are all aligned. In such a configuration, the package footprint is approximately the size of the dies themselves. Long wire die-to-die interconnections are required in this case, decreasing signal bandwidth. In the alternative, the die may be stacked in a shingle stack configuration, where the die edges are offset. Here, the wires may be bonded directly between dies, producing short die-to-die interconnects, but the package footprint is increased significantly over the footprint of a straight-up vertical stack having three dies or more in the stack. As demand for low-cost packages having small footprint and high performance is on the rise, there is a drive for improved 3D packaging taking advantage of the current wire bonding infrastructure.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1A:
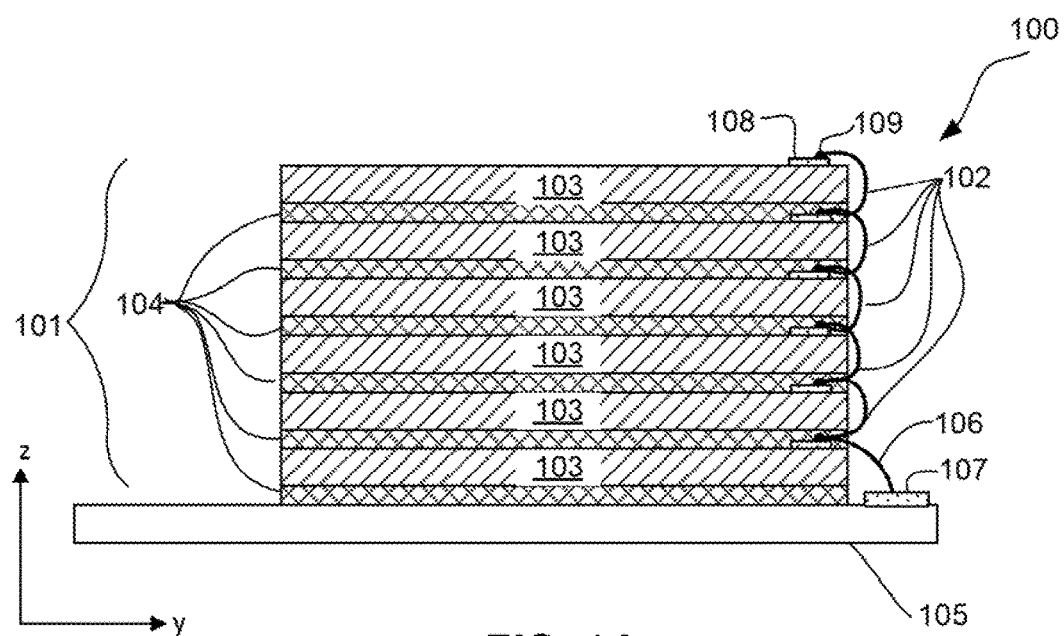
FIG. 1A illustrates a profile view of a straight-up stacked die packaging arrangement of multiple dies on a substrate having direct wire bonds between adjacent dies, according to some embodiments of the disclosure.

Demand for increasingly smaller and higher performance integrated circuits is driving development of 3D integration and packaging. In 3D design, individual IC dies are vertically stacked and interconnected to perform as a within a package. Interconnections between individual dies may be achieved by wire bonding or flip-chip technologies. While flip-chip interconnections provide for very high-performance signal paths and power routing due to direct die-to-die solder bonding, the infrastructure is expensive. For applications that do not require very high bandwidths, wire bonding interconnections generally suffice. Wire bonding tooling is very ubiquitous in IC fab facilities and the methodology is well established, making the technology more economic.

3D integration and packaging processing that utilize wire bonding for die interconnections have fallen into two categories for vertical die arrangements. First is stacking the dies on a package substrate with edges offset to expose bond pads at one or two edges of the dies. This is known in the industry as shingle stacking, and allows direct inter-die wire-bond interconnections to be made. In shingle stacking, dies are adhered to one another using an adhesive die attach film or paste. A second common technology is film-over-wire (FOW), where dies are stacked on a package substrate with edges aligned, known as "straight-up" die stacking. In straight-up die stacking, the wire bonding is made from die to substrate, where the wires are bonded to pads on top of the die and to a bond finger on the package substrate. The die are stacked and bonded one at a time. To accommodate the wire attached to the dies, the die attach film is softened at elevated temperatures to the point of liquefaction, and can flow over the attached wire on the die below. Upon curing, the die attach film forms a solidified mold encapsulating the wire and bond pads on the die below, as well as a solid adhesion layer.

The resulting FOW package has a smaller footprint that is obtained from shingle stacking, as the straight-up, or edge-aligned, configuration has a one-to-one correspondence or nearly so between package dimensions and die stack dimensions, while a greater than one-to-one correspondence between package dimensions and die stack dimensions is used for shingle die stacks. To meet demand for shrinking package size, FOW provides a solution, however, due to the long interconnect lengths of die-substrate-die, device performance in terms of bandwidth is compromised because of the long signal paths. Shingle stacking, on the other hand, provides for short signal paths due to direct die-to-die wire bonded interconnections, but results in a larger package footprint.

Some embodiments describe a 3D package building strategy that allows for a straight-up die stack to have direct die-to-die wire interconnections, incorporating the space-saving advantages of FOW 3D packaging technology and the higher device performance of shingle stack 3D packaging. In some embodiments, a die attach film is used that promotes the self-alignment of shingle stacked (edges offset) dies into a straight-up die stack. In this package building process, the die stack is formed by shingle-stacking dies and direct die-to-die interconnects by wire-bonding. In some embodiments, temperature regime is developed to liquefy the die attach film and cause the die to move under the surface tension in the liquefied die attach film layers between dies, pulling the edges together into a self-aligned straight up die stack. There are many technical effects of the various embodiments. Other technical effects may be evident from the description and figures of the various embodiments.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Here, "Bond pad" is a term generally referring to electrical bond pads in association with test points or external electrical connections of an integrated electronic device such as an IC or Micro-Electro-Mechanical System (MEMS) device. Related industry terms are "bonding pad" and "bump". Here, "Solder bump" or "solder ball" are terms generally referring to a ball of solder bonded to a bond pad for further assembly of the die into packages by use of surface mount technology, or for wire bonding.

Throughout the specification, and in the claims, the term "die" generally refers to a small piece of a processed semiconductor wafer that is diced into sections containing integrated circuits or other devices.

Here, the term "Die stack" generally refers to a vertical assembly of two or more dies containing integrated circuits, and are interconnected to function as a unit.

The terms "3D package" or "3D integration" generally refer to the process of encapsulating a die stack into a complete IC package, where the 3D package has a smaller footprint than that of a single die containing all of the circuitry. Related terminology includes the following: an "edge-aligned" die stack is a stack of same-sized dies where all of the edges are aligned with no offset. This configuration is sometimes referred to as a "straight-up" die stack.

Here, the term "offset edge" die stack generally refers to a stack of same-size dies having one or more edges offset horizontally from each other. This configuration is sometimes referred to as a "shingle stack".

Here, the term "Wire bonding" generally refers to a standard processing operation of making interconnects from a die to external contacts or to another die by thermal bonding of fine wire to bond pads both on the die and on package substrate.

Here, "daisy chain" is a term generally indicating serial wire connections between three or more adjacent dies in a stack. Here, the term "Staggered" generally refers to wire interconnects to non-adjacent dies in a stack, generally made between alternating dies in a stack.

Other terminology used throughout this disclosure include "connected", meaning a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. "Integrated circuit" (IC) is a microelectronic circuit produced monolithically on semiconductor wafer substrates by microfabrication methods. The term "signal" may refer to at least one current signal, voltage signal, magnetic signal, or data/clock signal. The meaning of "a," "an," and "the" include plural references. The meaning of "in" includes "in" and "on".

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-section" and "plan" correspond to orthogonal planes within a cartesian coordinate system. Thus, profile views are taken in the x-z plane, and plan views are taken in the x-y plane. Typically, profile views in the x-z plane are cross-sectional views.

FIG. 1A illustrates a profile view of package 100, comprising edge-aligned die stack 101, with wires 102 serially interconnecting adjacent dies 103 in a daisy-chained configuration. Although single wires 102 are shown interconnecting the individual dies in the profile view of FIG. 1A, it is understood that the embodiments of this disclosure are not limited to single wire interconnects, and that in some embodiments, multiple parallel wires may also be present along the edge or the die extending in the x-y plane. Between each die is adhesion film 104, which forms an adhesion layer between adjacent dies and with mounting substrate 105, to which die stack 101 is adhered also by die attach film 104, according to some embodiments.

In some embodiments, mounting substrate 105 may be a carrier substrate made from silicon, ceramic, glass or an organic material such as AB film, epoxy resins or glass-reinforced epoxy resin, as well as substrates or tapes of heat-resistant resins, phenolic substrates, and the like. Examples of materials include, but are not limited to silica, silicon, silicon oxide, silicon dioxide, silicon carbide, gallium, gallium arsenide, gallium phosphide, indium, indium phosphide, indium arsenide, zinc oxide, antimonide, $Al_2O_3$, silicon nitride ($SiN_3$), mullite ($Al_2O_3$—$SiO_2$), polyimides, epoxies, phenolics, cyanate esters, bismaleimides, and acrylonitrile-butadiene-styrene (ABS).

In some embodiments, the number of dies in edge-aligned die stack 101 may be unlimited, but in other embodiments, typically four or eight dies may be stacked. The z-height of edge-aligned die stack 101 is controlled by the thickness of individual dies 102 comprised by die stack 101, and the number of dies. Thicknesses of individual dies 102 range from 150 to 200 microns in some embodiments. In other embodiments, individual dies 102 have thicknesses of 75 microns. In other embodiments, individual dies 102 have a thickness of 25 microns.

Continuing with FIG. 1A, wires 103 form interconnections between adjacent dies 102 in die stack 101. According to some embodiments, wires 103 may be bonded from die-to-die by standard wire bonding methods as will be described below. In addition to die-to-die bonding, die-to-substrate bonding is also shown in FIG. 1A, where wire 106 connects the lowest die of die stack 101 to bond finger 107 disposed on the edge of mounting substrate 105, according to some embodiments. In conventional straight-up die stacking using FOW, where edges of a same-sized die are aligned, wires are routed from individual dies in the stack to bond fingers on the package substrate, and re-routed to other dies for die-to-die communication within the stack.

Using FOW methods, multiple wires are bonded between individual dies in a straight-up stack to a single bond finger, for example to distribute common signals between dies, or to form a ground connection to the mounting substrate. Bond fingers such as bond finger 107 are disposed on the mounting substrate 105 and may extend as a trace to another part of the substrate 105 to carry signals between the dies and an external circuit or pin, according to some embodiments.

As depicted in FIG. 1A, bond finger 107 is disposed peripherally on mounting substrate 105 and extends in the y-dimension. In contrast with FOW assembly of straight-up die stacks, a single wire 106 is bonded to bond finger 107, thus the length of the bond finger in the y-dimension is reduced, in turn reducing the length of the package in the y-dimension. As an example, a bond finger length of 0.5 mm in the y-dimension is needed to accommodate four wire bonds using conventional methods such as FOW. By using a single wire bond for attaching wire 106 to bond finger 107, the length is reduced to 0.24 mm in some embodiments.

Still referring to FIG. 1A, adhesion layer 104 is a die attach film disposed between adjacent dies 103, and encapsulates wires 102, according to some embodiments. As described in greater detail below, adhesion layer 104 comprises an epoxy resin polymer film having a glass transition temperature $T_g$ above the wire bonding temperature range of 150° C.-160° C. in some embodiments, where the viscosity of the resin is low enough to exhibit flow, thus undergoing a melt at the elevated temperatures. In some embodiments, adhesion layer 104 is applied as a partially cross-linked semisolid laminate film at wafer level, then remains attached to the dies after dicing the wafer. Adhesion layer 104 performs as a B-stage adhesive, where the resin is soft and pliable but strong enough to hold dies 103 in place once assembled into die stack 101, up to wire bond temperatures around 150° C.

At temperatures above 150° C., adhesion layers 104 are raised above their $T_g$ and liquefy, allowing the resin to flow, according to some embodiments. In some embodiments, adhesion layer 104 exhibits a high surface tension in the liquid state above $T_g$ (150° C.-160° C.), and will cause spontaneous self-alignment of dies within die stack 101 that are initially offset from one another. One mechanism for this behavior is the maximization of contact area of the resin with high energy surfaces of dies 102 (composed of primarily silicon oxides) once the resin is liquefied. In this way, the surface energy of the resin is minimized. Before assembly of the die stack, adhesion layer 104 is attached to the bottom side of dies 103 at wafer level.

During assembly of die stack 101, dies 103 may be shingle stacked, according to some embodiments, forming a stair-step or offset configuration. Above $T_g$, surface tension of the liquid resin pulls the offset dies over the die below, causing a spontaneous self-alignment of dies 103 from the shingle stack configuration into an edge-aligned die stack, such as die stack 101 in FIG. 1A. Under these conditions, adhesion layer 104 is capable of conformal attachment between dies 103, and can mold over wire attached to bond pads disposed on top sides of dies 103, in accordance with some embodiments. An exemplary assembly process for producing edge-aligned die stacks according to embodiments of this disclosure, such as die stack 101, is described below.

Figure 1B:
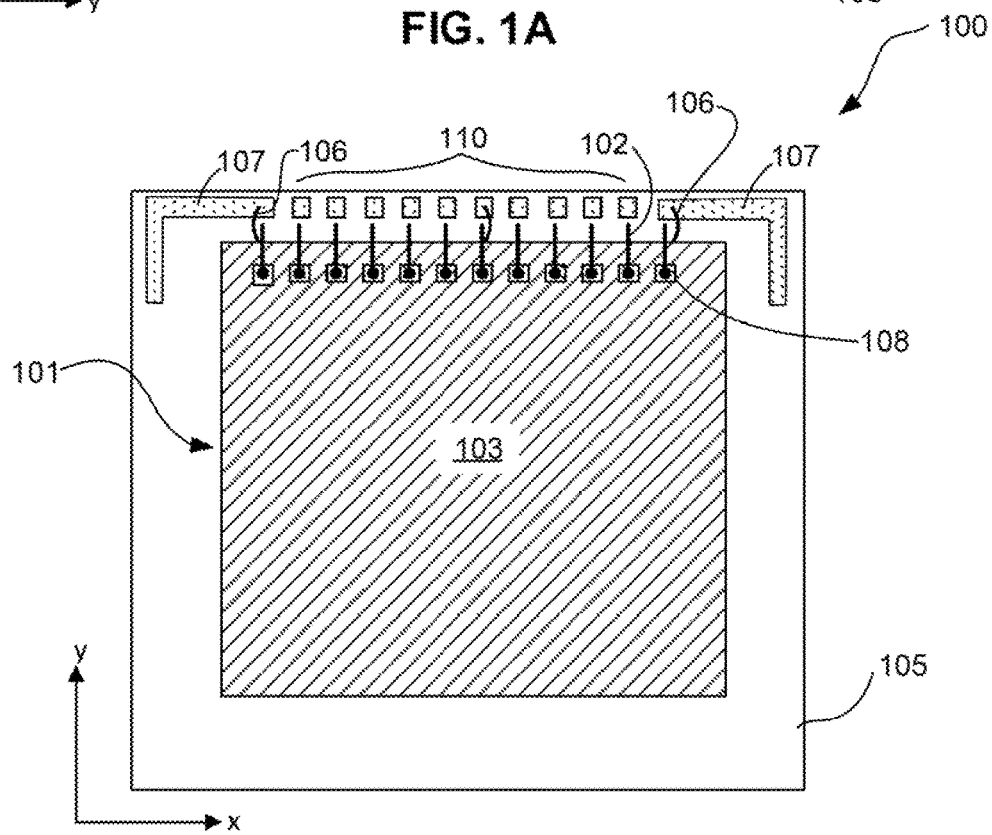
FIG. 1B illustrates a plan view of the straight-up stacked die packaging arrangement of FIG. 1A, according to some embodiments of the disclosure.

FIG. 1B illustrates a plan view of package 100 of FIG. 1A, according to some embodiments of the disclosure. In FIG. 1B, package 100 and die stack 101 are viewed from the top, showing the details of the die stack interconnect with bond fingers 107 through substrate interconnect wires 106. In some embodiments, substrate interconnect wires 106 are bonded to the lowest die in die stack 101, as shown in FIG. 1A. In other embodiments, one or more dies 103 higher in die stack 101 are directly interconnected with pads or bond fingers on mounting substrate 105.

Shown in FIG. 1B are multiple bonding pads 108 disposed on mounting substrate 105. In the depiction, most of bond pads 108 are not used, according to some embodiments. In other embodiments, multiple interconnections may be made between die stack 101 and bond pads 108. Inter-die wires 102 appear as straight lines in the figure, but are extending downward along the z-dimension from bond pads 109 distributed on the leading edge of the top die 103 in die stack 101. In some embodiments, all inter-die wires 102 shown in FIG. 1B are bonded directly to the adjacent die below, as shown in FIG. 1A. In other embodiments, some inter-die wires 102 are bonded to non-adjacent dies lower in die stack 101.

Die-to-die interconnections within die stack 101 are not limited to daisy chain arrangements, where a cascade of interconnections is made between adjacent dies. Die-to-die interconnections may also be made by attaching wires between alternating dies, or otherwise attaching wires between non-adjacent dies within die stack 101, according to some embodiments, as dictated by inter-die signal path requirements. In some embodiments, multiple dies may be attached to a particular die within die stack 101.

Figure 2A:
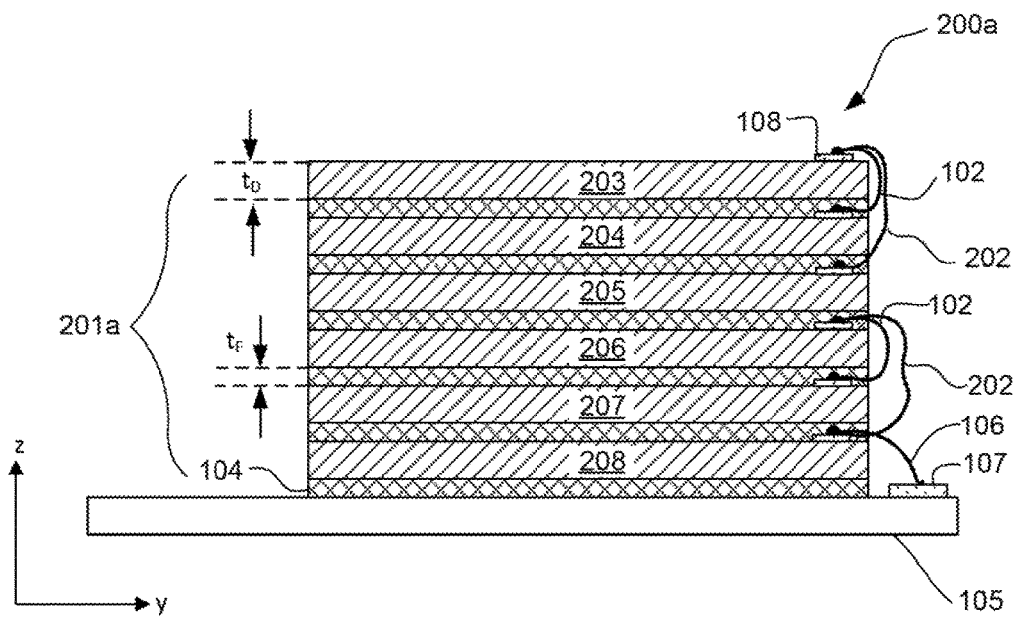
FIG. 2A illustrates a profile view of a straight-up stacked die packaging arrangement of multiple dies on a substrate having wire bonds between non-adjacent dies, according to some embodiments of the disclosure.

Examples of wire bonding arrangements with non-adjacent die interconnections are shown in FIG. 2A, showing package 200a and die stack 101. Interconnect wires 202 connect non-adjacent dies within die stack 201a, and interconnect wires 102 connect adjacent dies in die stack 101. Wires shown in FIG. 2A are in the same plane. In some embodiments, die 203 is connected in parallel to die 204 and 205, and die 206 is connected in parallel to die 107 and die 208. In the plane of FIG. 2A, dies 203, 204 and 205 appear to be isolated from dies 206, 207 and 208. In this plane, the signal path dictates the die interconnect scheme.

For example, a first data signal is generated by die 203 and routed to dies 204 and 205 for storage or processing. A second data signal is independently generated by die 206 and routed from a die bond pad 109 in the plane of the figure to dies 207 and 208 for storage or processing, where interconnect wires 202 connect to bond pads disposed on the other dies in the same position (y-z plane). In some embodiments, any one of dies 203-205 may be interconnected with any one of dies 206-208 in another y-z plane, corresponding to another die bond pad 109 position in another y-z plane. In some embodiments, the signal routing below the plane of the figure conducts signals from any one of dies 206-208 to any one of dies 203-205. In some embodiments, die 205 is connected to die 206 by one or more interconnection interconnect wires 102 in one or more planes below the plane of the figure. Die 208 is also shown connected to bond finger 107 for signal routing to circuitry external to die stack 201*a*.

In contrast to interconnect wire lengths used in FOW processing, where for example an interconnection between adjacent dies in a four-die stack is typically on the order 1.2 mm, here the length of interconnect wires 102 and 202 according to some embodiments of this disclosure are significantly shortened. For example, interconnect wires are routed from individual dies in the die stack to a bond finger on the substrate, and back to other dies within the die stack. In some embodiments, die thickness $t_D$ is 100 microns. Die-to-die spacing is also determined by the thickness $t_F$ of adhesion layer 104. In some embodiments, $t_F$ is 40 microns. Interconnect wires 102 connecting adjacent die are correspondingly long, where their length is on the order of 100 microns in some embodiments. The length of interconnect wires 102 depends on the initial loop length, which has a horizontal and vertical component, and is related to die offset in the initial stack assembly, as will be explained below. From the perspective of device performance, a large improvement in signal bandwidth is obtained by direct die-to-die interconnections, as the shorter wires have less inductance than is obtained by the wire routing in FOW die stacks, permitting higher data rates between dies, according to some embodiments.

Figure 2B:
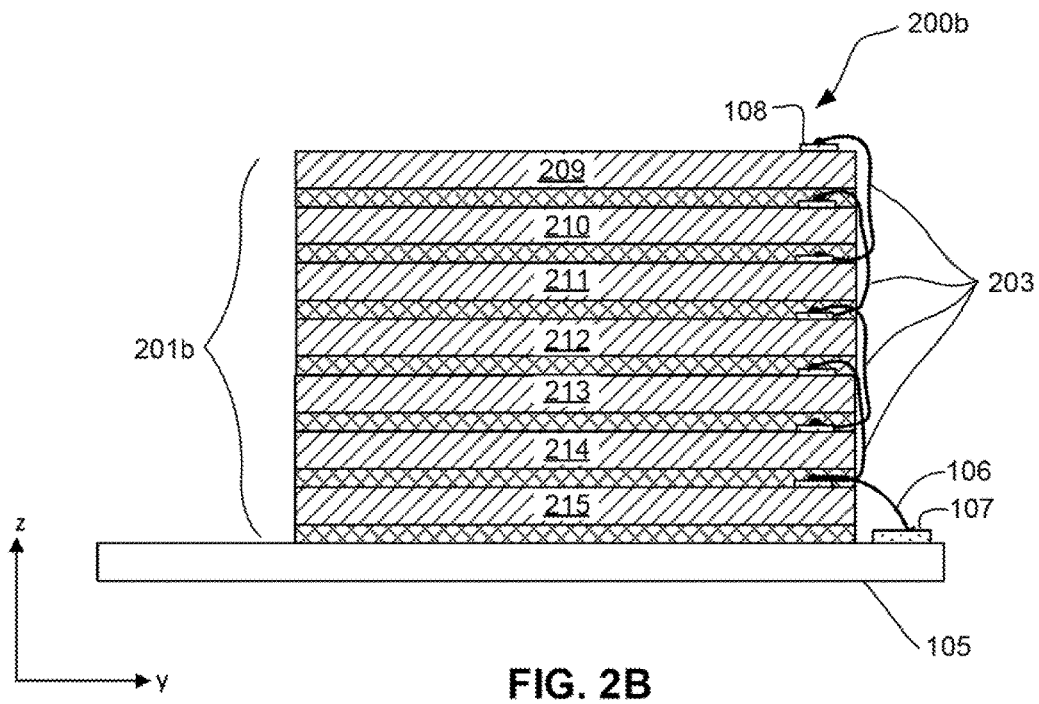
FIG. 2B illustrates a profile view of a straight-up stacked die packaging arrangement of multiple dies on a substrate having staggered wire bonds between dies in the stack, according to some embodiments of the disclosure.

In FIG. 2B, a staggered interconnect arrangement is shown, where interconnections are made between every second die in die stack 201*b*. Alternate dies are interconnected in this signal routing scheme, in accordance with some embodiments. Die 209 and die 211 are interconnected by one interconnect wire 203; die 210 is connected to die 212 also by an interconnect wire 203, and die 213 is connected to die 215. Die 212 is also connected to die 214. The staggered die interconnection scheme interconnects pairs of non-adjacent dies that appear to be isolated from the other die pairs, but the die pairs may be interconnected by interconnect wires in other y-z planes not shown in FIG. 2B.

In some embodiments, die 212 is a processor chip, and is interconnected to dies 210 and 214, which are memory chips. In some embodiments, die 209 and 211 are processor/memory chip pairs, as well as die 213 and die 215. Although longer than interconnect wires 102, interconnect wires 203 are significantly shorter than required for die-to-die interconnection in FOW die stacks, according to some embodiments.

Figure 3A:
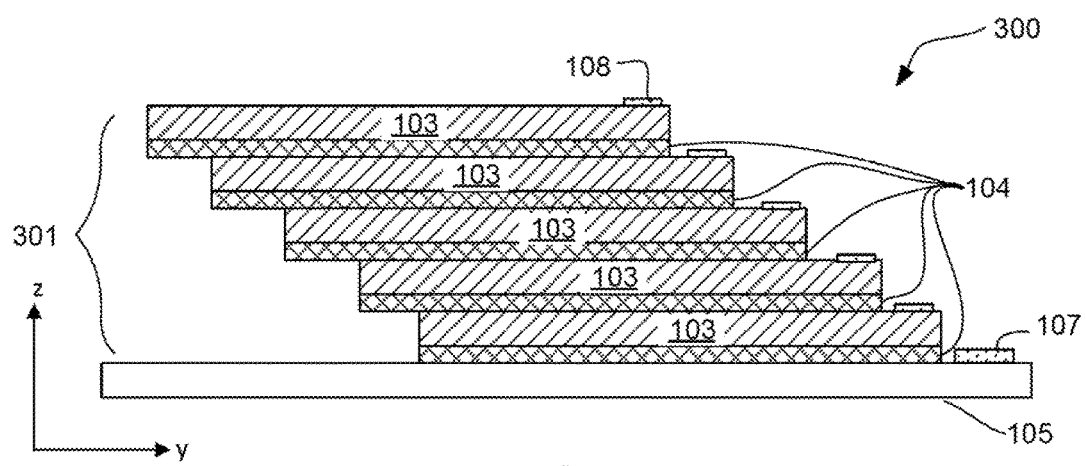
FIG. 3A illustrates a profile view of multiple dies stacked in a shingle arrangement before wire bonding, according to some embodiments of the disclosure.

FIG. 3A illustrates a process of a method of forming an edge-aligned die stack assembly according to embodiments of this disclosure, where a profile view of an assembly of dies stacked in a shingle arrangement 300 is shown in preparation for wire bonding to pads at or near the leading edges of the dies, according to some embodiments of the disclosure.

In FIG. 3A, die stack 301 is shown preassembled in a shingle configuration, where dies 103 are stacked with edges offset in the y-dimension on substrate 105, with leading edges of dies 103 proximal to bond finger 107. In some embodiments, dies 103 are stacked with edges offset both in the x-dimension (e.g., above and below the plane of the figure) and the y-dimension. In edge-offset (shingle) configuration, bond pads 108 are exposed for wire bonding. Dies 103 are attached to one another by adhesive layers 104, where in some embodiments the assembly is B-staged.

In some embodiments, adhesive layers 104 are a die attach film that is laminated onto the backside of a wafer from which the dies are cut. In some embodiments, adhesive layers 104 are applied to a wafer from which the dies are singulated in liquid form, by spin coating or spray coating. In some embodiments, adhesive layers are applied as a paste to singulated dies. In some embodiments, at the stage of die stack assembly depicted in FIG. 3A, adhesive layers 104 are partially cured to a semisolid state to enable building die stack 301 by tacking down a first die 103 on substrate 105, then tacking a second die 103 on top of the first die 103 with edges offset, etc., until die stack 301 is completely assembled. The adhesion of adhesion layer 104 is moderate, and is strong enough to hold the assembly together for wire bonding at temperatures of approximately 150° C.

Figure 3B:
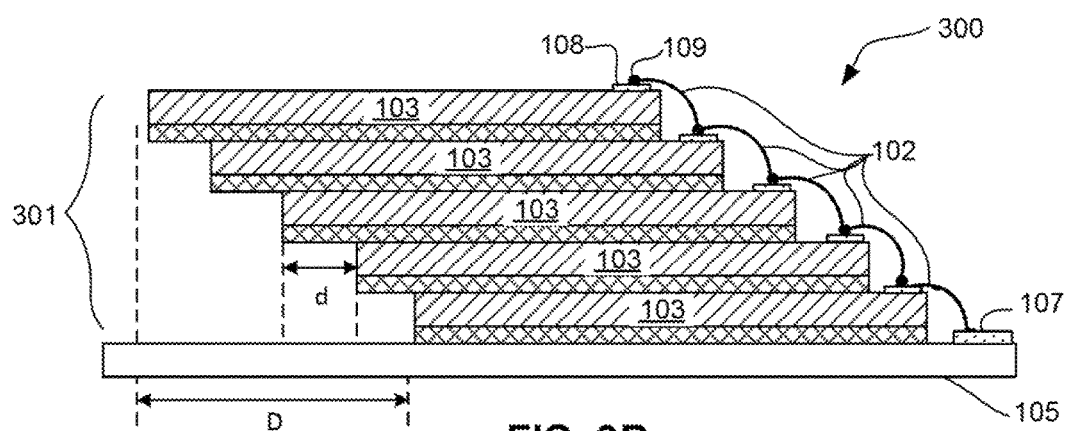
FIG. 3B illustrates a profile view of multiple dies stacked in a shingle arrangement after bonding wires between adjacent dies, according to some embodiments of the disclosure.

FIG. 3B illustrates a profile view of package 300 comprising multiple dies stacked in a shingle arrangement die stack after bonding wires between adjacent dies, according to some embodiments of the disclosure.

In FIG. 3B, adjacent dies 103 are interconnected in a daisy chain configuration by wires 102 during a wire bonding step at elevated temperatures (e.g., approximately 150° C.). In some embodiments, balls 109 are formed and bonded to bond pads 108 by the wire bonding process, and wires 102 are then bonded to balls 109. Materials for wires 102 and balls 109 may be any one of, but not limited to, gold, copper, silver, aluminum and alloys of aluminum, according to some embodiments. In some embodiments, wires 102 are forward bonded in the following manner.

A first end of a first wire 102 is bonded to first ball 109 on first bond pad 108 of first die 103, and a second end is stitch bonded to second bond pad 108 on second die 103 below first die 103. The process is then repeated, with a first end of a second wire 102 bonded to a second ball 109 on second bond pad 108, then a second end of the second wire 102 stitch bonded to a third bond pad 108 on a third die 103 below second die 103. Finally, wire attachment is made to bond finger 107 on substrate 105. In other embodiments, wires 102 are reverse bonded. In some embodiments, loop length of wires 102 is slightly larger than the thickness of dies 103 to accommodate the offset.

Also indicated in FIG. 3B is the offset distance d between die 103, and the cumulative offset D of die stack 301. In some embodiments, d is between 0.3 to 0.5 mm. For die stack 301 comprising five dies, as shown in FIGS. 3A and 3B, cumulative offset D is 1.2 to 2 mm, which is added to the die length in the y-dimension, resulting in a die stack footprint equal to D summed with the die length. For die stacks comprising even more dies, offset D is larger, increasing the overall footprint of package 300.

Figure 3C:
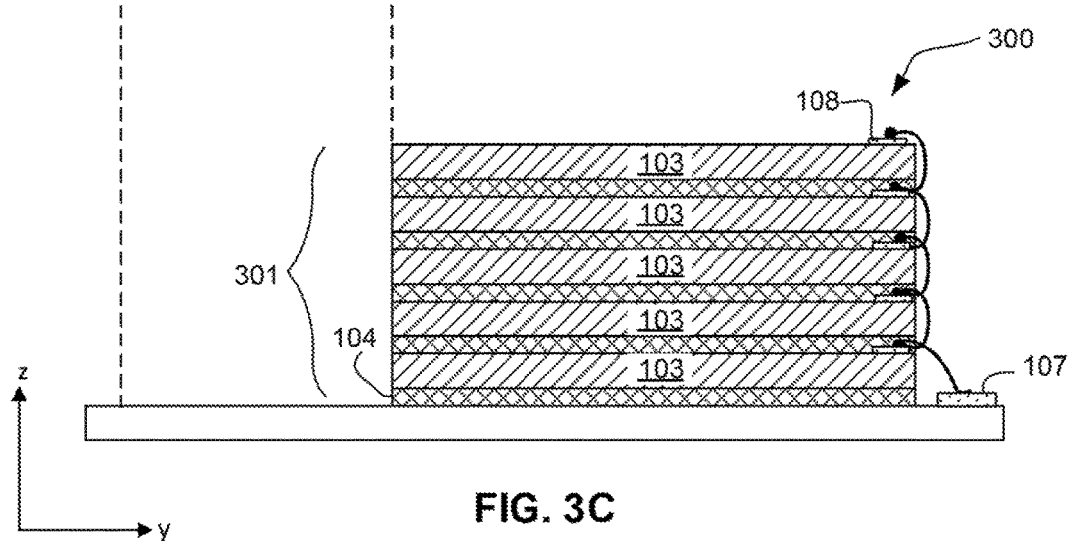
FIG. 3C illustrates a profile view of multiple dies in an edge-aligned arrangement after bonding wires between adjacent dies, according to some embodiments of the disclosure.

FIG. 3C illustrates a profile view of 3D package 300 comprising multiple dies in an edge-aligned arrangement after bonding wires between adjacent dies, according to some embodiments of the disclosure.

In FIG. 3C, dies 103 have undergone self-alignment, where surface tension in adhesion layers 104 causes die edges to align spontaneously at elevated temperatures, removing the offsets d. The result is an edge-aligned die stack also having short interconnects between an adjacent die, according to some embodiments. In other embodiments, interconnect wires are bonded to non-adjacent dies. Such configuration may not be achievable using FOW methods, as dies are edge aligned during assembly of the die stack, with each interconnect wire bonded to the die and the bond finger separately. Although package space is saved due to straight-up stacking in FOW assembly, daisy chaining dies together or otherwise making direct inter-die connections may not be possible.

The package space saving in lateral dimensions is at least the distance D in the y-dimension, in accordance with some embodiments. As described here, a 3D package fabricated in this manner may have a reduced footprint by 1-2 mm, according to some embodiments, while having direct inter-die connections. Due to the short interconnects, signal bandwidth is increased, enhancing device performance.

Figure 4A:
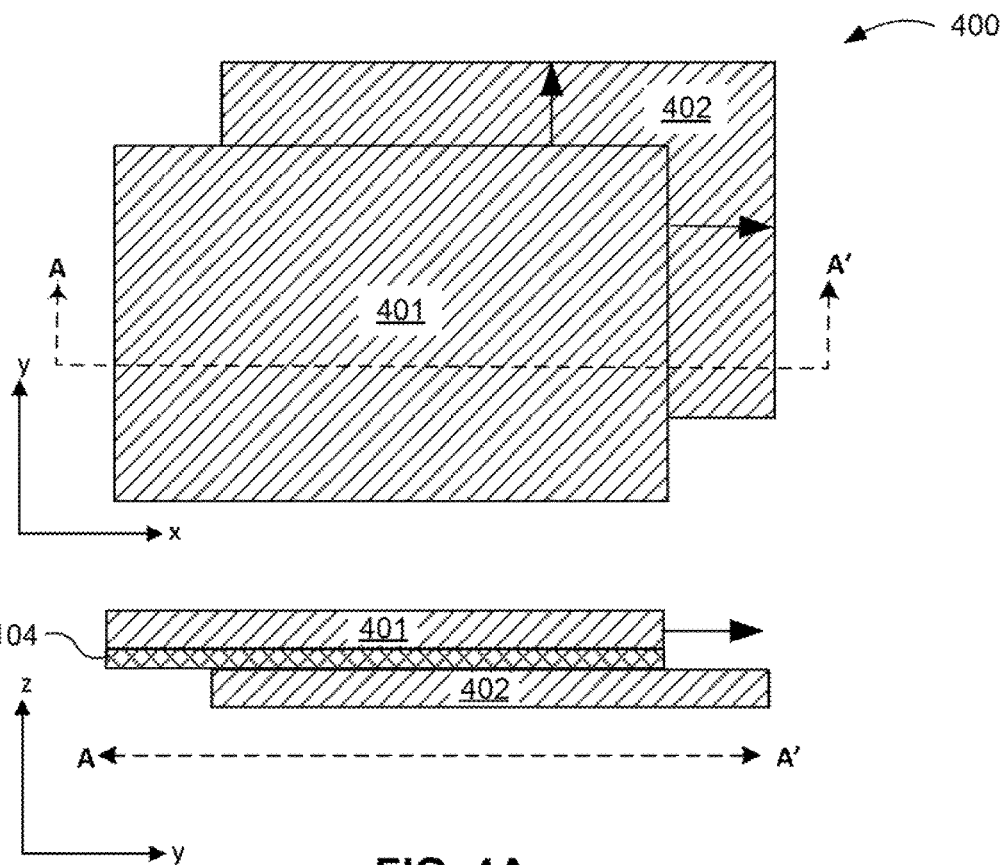
FIG. 4A illustrates both a plan view and profile view of two die stacked in a shingle arrangement, showing two offset edges in a pre-alignment step, according to some embodiments of the disclosure.

FIG. 4A illustrates both a plan view and profile view of die stack 400 comprising two dies stacked in a shingle arrangement, showing two offset edges in a pre-alignment step, according to some embodiments of the disclosure.

Figure 4B:
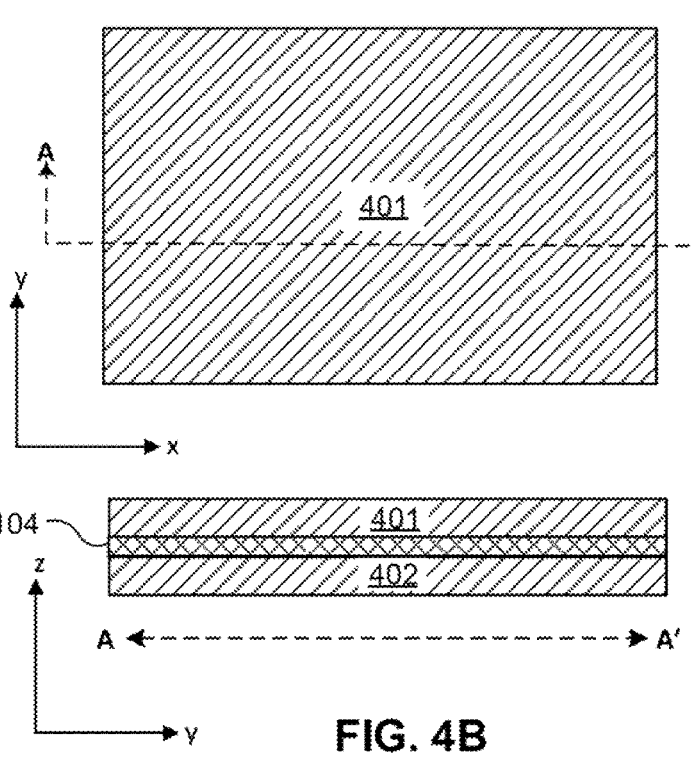
FIG. 4B illustrates both a plan view and a profile view of the two die of FIG. 4A spontaneously formed into in an edged-aligned die stack arrangement, according to some embodiments of the disclosure.

An illustration of the self-alignment process is shown in FIGS. 4A and 4B. In FIG. 4A, two vertically stacked dies 401 and 402 in die stack 400 are shown with edges offset in both x-dimension and y-dimension. The profile view shows adhesion layer 104 intervening between dies 401 and 402. As the die stack is subjected to temperatures above the glass transition temperature ($T_g$) of adhesion layer 104, die 401 spontaneously aligns with die 402 in both the x-dimension and y-dimension. This is indicated by the arrows.

In some embodiments, adhesion layer 104 is an epoxy resin having the property of having very low viscosity above the glass transition temperature ($T_g$) and before curing sets in. In some embodiments, adhesion layer 104 has a $T_g$ between 130° C. and 140° C. In some embodiments, adhesion layer 104 has a viscosity ranging between 500 and 1000 Pa-s (Pascal-seconds), or $5 \times 10^5$ to $1 \times 10^6$ centipoise (cP), at temperatures above $T_g$. In some embodiments, adhesion layer 104 has an elastic modulus ranging between $5 \times 10^7$ and $7 \times 10^7$ Pa between 150° C. and 300° C. In some embodiments, adhesion layer 104 has a cure time between 40 and 50 minutes, where the cure time is measured from the time the temperature of adhesion layer 104 is raised to a temperature of $T_g$ or higher. In some embodiments, adhesion layer 104 has a viscosity that is substantially constant at $5 \times 10^5$ cP between the time the temperature of adhesion layer 104 reaches a cure temperature of $T_g$ or higher, until it sharply rises, indicating the end of the cure phase as rapid latent cross-linking occurs after 40 to 50 minutes of exposure to the cure temperature.

In FIG. 4B, the self-alignment process has completed, where the edges of die 401 are substantially aligned with the edges of die 402. As adhesion layer 104 liquefies above $T_g$ of adhesion layer 104, surface tension causes die 401 to move relative to die 402, pulling die 401 over die 402. In some embodiments, adhesion layer 104 has a strong affinity for the high-energy polar surfaces of dies 401 and 402, comprising oxides of silicon. The movement of die 401 relative to die 402 continues until the edges are aligned, as the contact area between adhesion layer 104 and die surface is maximized when overlap is maximum, resulting in a thermodynamically stable state. In some embodiments, adhesion layer 104 is optimized to allow for self-alignment before the cure phase begins. In some embodiments, the self-alignment process completes in less than 40 minutes at temperatures above the $T_g$ of adhesion layer 104. Once cured, adhesion layer 104 transforms to a thermoset resin, forming a solid stable polymeric material that cannot deform or melt, in accordance with some embodiments.

Figure 5:
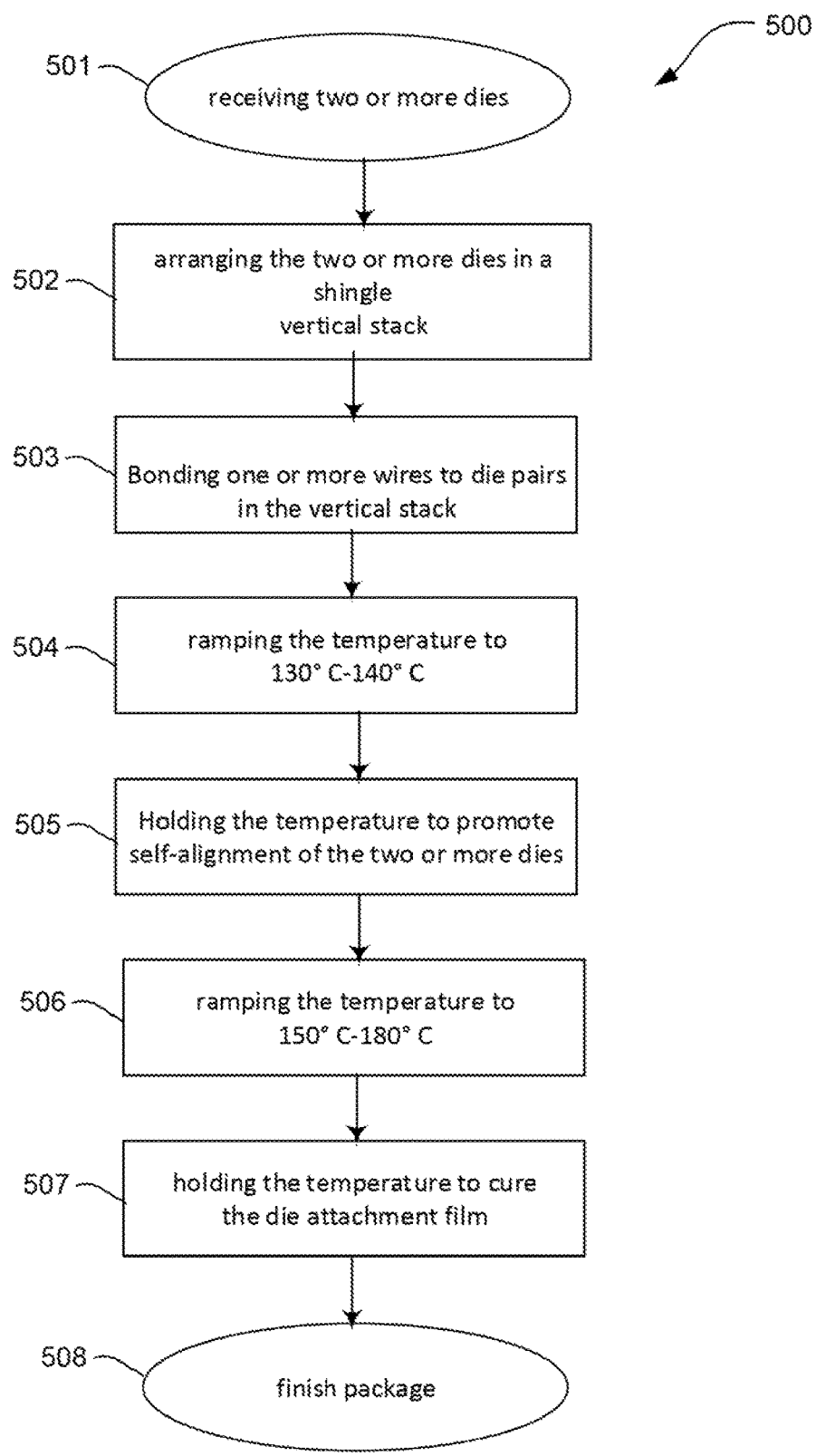
FIG. 5 illustrates a flow chart of an exemplary process for making an edge-aligned die stack having wires bonded to adjacent die, according to some embodiments of the disclosure.

FIG. 5 illustrates a flow chart 500 of an exemplary process for making an edge-aligned die stack having wires bonded to adjacent die, according to some embodiments of the disclosure. Although the blocks in the flowchart with reference to FIG. 5 are shown in a particular order, the order of the actions can be modified. Thus, the illustrated embodiments can be performed in a different order, and some actions/blocks may be performed in parallel. Some of the blocks and/or operations listed in FIG. 5 are optional in accordance with certain embodiments. The numbering of the blocks presented is for the sake of clarity and is not intended to prescribe an order of operations in which the various blocks must occur. Additionally, operations from the various flows may be utilized in a variety of combinations.

The exemplary process flow described by flow chart 500 presented in FIG. 5 summarizes the descriptions of FIGS. 3A though 4B for making a 3D integrated package comprising an edge-aligned die stack having direct inter-die wire bonds, and comprises operations 501-508. At operation 501, dies to be mounted on a mounting substrate are received for packaging. In some embodiments, a wafer bearing the dies is laminated on the backside with a die attach film (DAF) having the properties described for adhesion layer 104. The die-bearing wafer is then singulated into individual dies, each retaining the DAF. In some embodiments, the die attach film is a dicing die attach film (DDAF).

At operation 502 in FIG. 5, two or more dies are assembled into a vertical stack having a shingle stack configuration as shown in FIG. 3A. In some embodiments, operation 502 is performed with a pick-and-place apparatus. In some embodiments, the dies are pressed together at room temperature. In some embodiments, the dies are pressed together at elevated temperatures below the $T_g$ of the DAF, where the DAF softens to facilitate tack, forming a B-stage adhesive.

At operation 503, interconnect wires are bonded to each of the dies in the vertical stack. In some embodiments, a wire bonding machine is employed to automate the wire bonding. In some embodiments, pairs of adjacent dies are daisy chained by bonding adjacent dies in series. In some embodiments, die pairs comprising non-adjacent dies are interconnected by attaching wires between non-adjacent dies within the stack. In some embodiments, forward wire bonding is employed. In some embodiments, reverse wire bonding is employed. In some embodiments, ball bonding is employed. In some embodiments, multiple wires are bonded to each die.

At operation 504, the temperature of the die stack is raised above the Tg of the DAF so that the DAF will liquefy. In some embodiments, the temperature is raised to between 130° C. and 140° C.

At operation 505, the temperature is held long enough to allow self-alignment of the die, as described above for FIGS. 4A and 4B. In some embodiments, the hold time is 40 to 50 minutes. In some embodiments, the self-alignment process is assisted by an alignment jig. In some embodiments, the self-alignment process is assisted by applying a vacuum.

At operation 506, the temperature is raised for final cure. In some embodiments, the temperature is raised to between 150° C. and 160° C.

At operation 507, the temperature is held to cure the DAF.
At operation 508, the 3D package is finalized and encapsulated.

Figure 6:
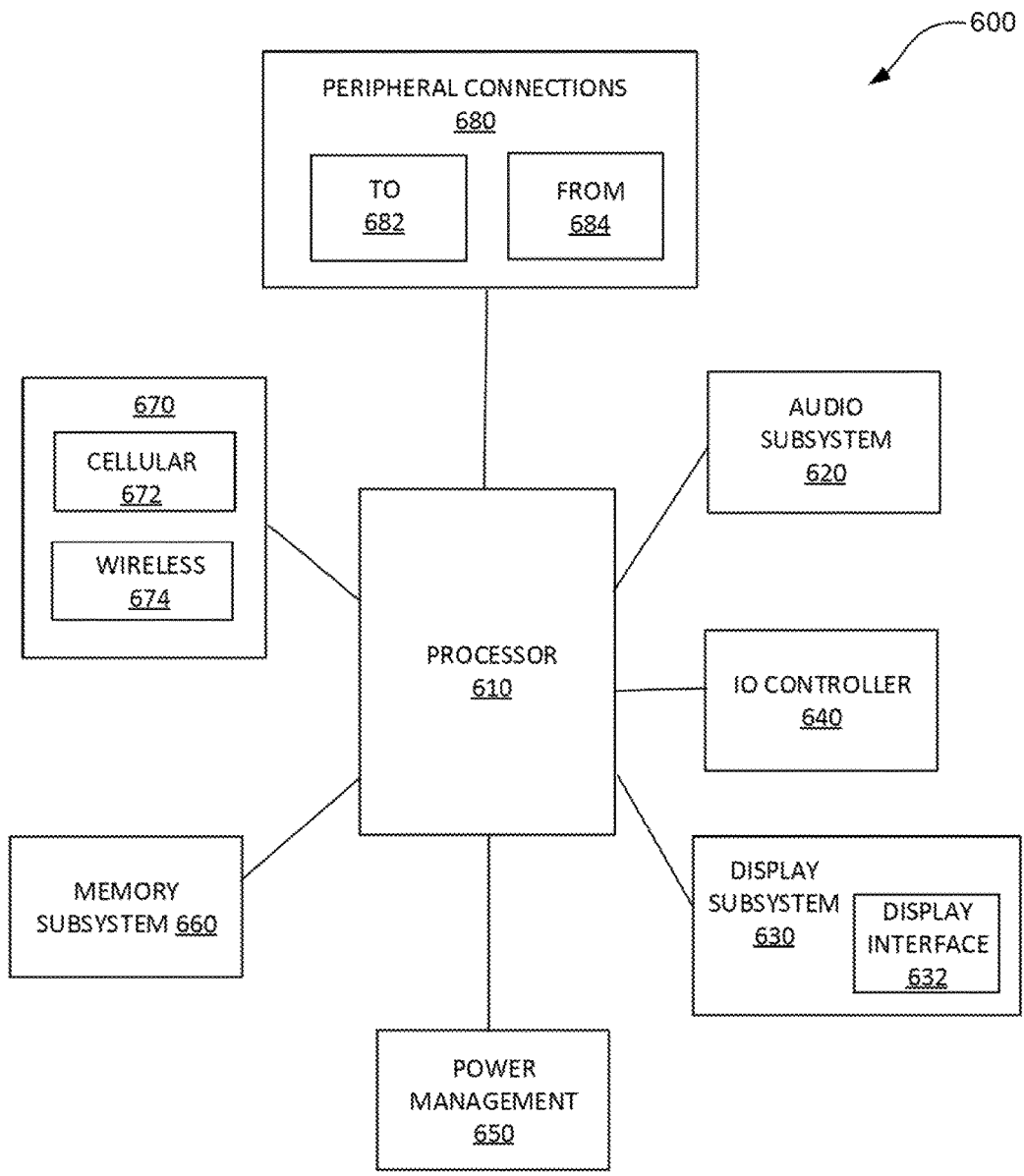
FIG. 6 illustrates a block diagram of a system on chip (SoC) comprising a multiple die stack package according to some embodiments of the disclosure.

FIG. 6 illustrates a package with a 3D package comprising an edge-aligned die stack having direct inter-die connections as part of a system-on-chip (SoC) package in an implementation of computing device 600, according to some embodiments of the disclosure. In some embodiments, some or all blocks of the SoC can be stacked in a 3D package such that the die edges are aligned.

FIG. 6 illustrates a block diagram of an embodiment of a mobile device in which flat surface interface connectors could be used. In some embodiments, computing device 600 represents a mobile computing device, such as a computing tablet, a mobile phone or smart-phone, a wireless-enabled e-reader, or other wireless mobile device. It will be understood that certain components are shown generally, and not all components of such a device are shown in computing device 600.

In some embodiments, computing device 600 includes a first processor 610. The various embodiments of the present disclosure may also comprise a network interface within 670 such as a wireless interface so that a system embodiment may be incorporated into a wireless device, for example, cell phone or personal digital assistant.

In one embodiment, processor 610 can include one or more physical devices, such as microprocessors, application processors, microcontrollers, programmable logic devices, or other processing means. The processing operations performed by processor 610 include the execution of an operating platform or operating system on which applications and/or device functions are executed. The processing operations include operations related to I/O (input/output) with a human user or with other devices, operations related to power management, and/or operations related to connecting the computing device 600 to another device. The processing operations may also include operations related to audio I/O and/or display I/O.

In one embodiment, computing device 600 includes audio subsystem 620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 600, or connected to the computing device 600. In one embodiment, a user interacts with the computing device 600 by providing audio commands that are received and processed by processor 610.

Display subsystem 630 represents hardware (e.g., display devices) and software (e.g., drivers) components that provide a visual and/or tactile display for a user to interact with the computing device 600. Display subsystem 630 includes display interface 632 which includes the particular screen or hardware device used to provide a display to a user. In one embodiment, display interface 632 includes logic separate from processor 610 to perform at least some processing related to the display. In one embodiment, display subsystem 630 includes a touch screen (or touch pad) device that provides both output and input to a user.

I/O controller 640 represents hardware devices and software components related to interaction with a user. I/O controller 640 is operable to manage hardware that is part of audio subsystem 620 and/or display subsystem 630. Additionally, I/O controller 640 illustrates a connection point for additional devices that connect to computing device 600 through which a user might interact with the system. For example, devices that can be attached to the computing device 600 might include microphone devices, speaker or stereo systems, video systems or other display devices, keyboard or keypad devices, or other I/O devices for use with specific applications such as card readers or other devices.

As mentioned above, I/O controller 640 can interact with audio subsystem 620 and/or display subsystem 630. For example, input through a microphone or other audio device can provide input or commands for one or more applications or functions of the computing device 600. Additionally, audio output can be provided instead of, or in addition to display output. In another example, if display subsystem 630 includes a touch screen, the display device also acts as an input device, which can be at least partially managed by I/O controller 640. There can also be additional buttons or switches on the computing device 600 to provide I/O functions managed by I/O controller 640.

In one embodiment, I/O controller 640 manages devices such as accelerometers, cameras, light sensors or other environmental sensors, or other hardware that can be included in the computing device 600. The input can be part of direct user interaction, as well as providing environmental input to the system to influence its operations (such as filtering for noise, adjusting displays for brightness detection, applying a flash for a camera, or other features).

In one embodiment, computing device 600 includes power management 650 that manages battery power usage, charging of the battery, and features related to power saving operation. Memory subsystem 660 includes memory devices for storing information in computing device 600. Memory can include nonvolatile (state does not change if power to the memory device is interrupted) and/or volatile (state is indeterminate if power to the memory device is interrupted) memory devices. Memory subsystem 660 can store application data, user data, music, photos, documents, or other data, as well as system data (whether long-term or temporary) related to the execution of the applications and functions of the computing device 600.

Elements of embodiments are also provided as a machine-readable medium (e.g., memory 660) for storing the computer-executable instructions. The machine-readable medium (e.g., memory 660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity via network interface 670 includes hardware devices (e.g., wireless and/or wired connectors and communication hardware) and software components (e.g., drivers, protocol stacks) to enable the computing device 600 to communicate with external devices. The computing device 600 could be separate devices, such as other computing devices, wireless access points or base stations, as well as peripherals such as headsets, printers, or other devices.

Network interface 670 can include multiple different types of connectivity. To generalize, the computing device 600 is illustrated with cellular connectivity 672 and wireless connectivity 674. Cellular connectivity 672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 674 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 680 include hardware interfaces and connectors, as well as software components (e.g., drivers, protocol stacks) to make peripheral connections. It will be understood that the computing device 600 could both be a peripheral device ("to" 682) to other computing devices, as well as have peripheral devices ("from" 684) connected to it. The computing device 600 commonly has a "docking" connector to connect to other computing devices for purposes such as managing (e.g., downloading and/or uploading, changing, synchronizing) content on computing device 600. Additionally, a docking connector can allow computing device 600 to connect to certain peripherals that allow the computing device 600 to control content output, for example, to audiovisual or other systems.

In addition to a proprietary docking connector or other proprietary connection hardware, the computing device 600 can make peripheral connections 680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

Example 1 is an IC package comprising a substrate and two or more vertically stacked dies disposed within the substrate, wherein all the edges of the two or more dies are aligned with respect to one another, and wherein at least two dies of the two or more vertically stacked dies are coupled directly by at least one wire bonded to a die of the two or more vertically stacked dies.

Example 2 includes all of the features of example 1, further comprising a die attachment film disposed between adjacent dies of the two or more vertically stacked die, wherein the die attachment film is to liquefy at approximately a glass transition temperature of the die attachment film.

Example 3 includes all of the features of example 1, wherein the at least two dies of the two or more vertically stacked dies are adjacent to one another.

Example 4 includes all of the features of example 1, further comprising a bond finger disposed within the substrate, wherein the bond finger has a length of 300 microns or less.

Example 5 includes all of the features of example 2, wherein a thickness of the die attach film is less than 40 microns.

Example 6 includes all of the features of example 1, wherein the two or more vertically stacked dies comprise a first die and a second die, and at least one intermediate die is disposed between the first die and the second die.

Example 7 includes all of the features of example 6, wherein the at least one wire is bonded to the second die and to the at least one intermediate die immediately above the second die.

Example 8 includes all of the features of examples 6 or 7, wherein the at least one wire is bonded to the second die and to the at least one intermediate die immediately above the second die.

Example 9 includes all of the features of any one of examples 6 through 8, wherein the at least one intermediate die comprises two or more intermediate dies, and wherein the two or more intermediate dies are coupled in series by a daisy chain arrangement of at least one wire bonded to each of the two or more intermediate dies.

Example 10 includes all of the features of any one of examples 6 through 9, wherein at least one wire is bonded to the first die and the second die.

Example 11 includes all of the features of any one of examples 6 through 9, wherein at least one wire is bonded to the first die and to any one of the at least one intermediate die.

Example 12 includes all of the features of any one of examples 6 through 9, wherein at least one wire is bonded to the second die and to any one of the at least one intermediate die.

Example 13 includes all of the features of any one of examples 6 through 12, wherein the two or more intermediate dies are adjacently coupled to each other by at least one wire bonded to two adjacent intermediate dies.

Example 14 includes all of the features of any one of examples 6 through 12, wherein the two or more intermediate dies are non-adjacently coupled to each other by at least one wire bonded to two non-adjacent intermediate dies.

Example 15 includes all of the features of example 1, wherein the two or more dies have substantial equal length and equal width.

Example 16 includes all of the features of any one of examples 7 through 9, wherein the at least one wire has a length of less than 200 microns.

Example 17 is a method comprising receiving at least two dies having a die attachment film laminated on one side, arranging the at least two dies in a shingle vertical die stack, the at least two dies having laterally offset edges in at least one dimension, bonding at least one wire to a first die of the at least two dies and to a second die of the at least two dies such that the at least two dies are interconnected, ramping a temperature of the vertical die stack to at least a glass transition temperature of the die attachment film, holding the temperature of the vertical die stack until the laterally offset edges of the at least two die self-align to have substantially zero lateral offset, ramping the temperature of the vertical die stack to a curing temperature of the die attachment film; and holding the temperature of the vertical die stack until the die attachment film is substantially cured.

Example 18 includes all of the features of example 17, wherein bonding at least one wire to a first die of the at least two dies and to a second die of the at least two dies such that the at least two dies are interconnected comprises bonding at least one wire to the second die of the at least two dies and a third die of the at least two dies.

Example 19 includes all of the features of example 17, wherein ramping the temperature of the vertical die stack to at least the glass transition temperature of the die attachment film comprises ramping the temperature of the vertical die stack to between 150° C. and 160° C.

Example 20 includes all of the features of example 17, wherein ramping the temperature of the vertical die stack to a curing temperature of the die attachment film comprises ramping the temperature of the vertical die stack to between 160° C. and 180° C.

Example 21 includes all of the features of example 17 wherein holding the temperature of the vertical die stack until the laterally offset edges of the at least two dies self-align comprises placing the vertical die stack in a vertical alignment jig to assist the self-alignment of the at least two dies.

Example 22 includes all of the features of example 17, wherein holding the temperature of the vertical die stack until the laterally offset edges of the at least two dies self-align comprises applying a vacuum to assist the self-alignment of the at least two dies.

Example 23 includes all of the features of examples 17 or 18, wherein the first die of the at least two dies is a topmost die of the vertical die stack and the second die of the at least two dies is a bottom-most die of the vertical die stack.

Example 24 includes all of the features of examples 17 or 18, wherein the third die of the at least two dies is an intermediate die of the vertical die stack.

Example 25 includes all of the features of any one of examples 17, 18, 23 and 24, wherein bonding at least one wire to a first die of the at least two dies and to a second die of the at least two dies such that the at least two dies are interconnected comprises bonding at least one wire to the topmost die of the vertical die stack and the bottom-most die of the vertical die stack.

Example 26 includes all of the features of any one of examples 17, 18, 23 and 24, wherein bonding at least one wire to a first die of the at least two dies and to a second die of the at least two dies such that the at least two dies are interconnected comprises bonding at least one wire to the topmost die and to the at least one intermediate die disposed immediately below the topmost die.

Example 27 includes all of the features of any one of examples 17, 18, 23 and 24, wherein bonding at least one wire to a first die of the at least two dies and to a second die of the at least two dies such that the at least two dies are interconnected comprises bonding at least one wire to the bottom-most die and to the at least one intermediate die immediately above the bottom-most die.

Example 28 includes all of the features of any one of examples 17, 18, 23 and 24, wherein bonding at least one wire to a first die of the at least two dies and to a second die of the at least two dies such that the at least two dies are interconnected comprises bonding at least one wire bonded to each of the two or more intermediate dies in a daisy chain arrangement.

Example 29 includes all of the features of any one of examples 17, 18, 23, 24 and 28, wherein bonding at least one wire to a first die of the at least two dies and to a second die of the at least two dies such that the at least two dies are interconnected comprises bonding at least one wire to the topmost die and to any one of at least one intermediate die.

Example 30 includes all of the features of any one of examples 17, 18, 23, 24 and 28, wherein bonding at least one wire to a first die of the at least two dies and to a second die of the at least two dies such that the at least two dies are interconnected comprises bonding at least one wire to the bottom-most die and to any one of the at least one intermediate die.

Example 31 includes all of the features of any one of examples 17, 18, 23, 24 and 28, wherein bonding at least one wire to a first die of the at least two dies and to a second die of the at least two dies such that the at least two dies are interconnected comprises bonding at least one wire to two adjacent intermediate dies.

Example 32 includes all of the features of any one of examples 17, 18, 23, 24 and 28, wherein bonding at least one wire to a first die of the at least two dies and to a second die of the at least two dies such that the at least two dies are interconnected comprises bonding at least one wire to two adjacent intermediate dies.

Example 33 includes all of the features of any one of examples 17, 18, 23, 24 and 28, wherein bonding at least one wire to a first die of the at least two dies and to a second die of the at least two dies such that the at least two dies are interconnected comprises bonding at least one wire to two non-adjacent intermediate dies.

Example 34 includes all of the features of example 17, wherein receiving at least two dies having a die attachment film laminated on one side comprises receiving at least two dies cut from a wafer having the die attachment film laminated on one side before singulating into dies.

Example 35 includes all of the features of examples 17 or 34, wherein the die attachment film is laminated on one side of the wafer in a liquid state.

Example 36 includes all of the features of any one of examples 17, 34 and 35, wherein the glass transition temperature of the die attachment film is between 150° C. to 160° C.

Example 37 is a system, comprising a processor coupled to a memory, wherein the processor and/or the memory comprise at least one vertically integrated die stack disposed within a substrate, the vertically integrated die stack comprising two or more vertically stacked dies, wherein all the edges of the two or more dies are aligned, wherein at least two dies of the two or more vertically stacked dies are coupled directly by at least one wire bonded to each die of the two or more vertically stacked dies; and a die attachment film disposed between adjacent dies of the two or more vertically stacked dies, wherein the die attachment film liquefies at approximately the glass transition temperature of the die attachment film and a wireless interface to allow the processor to communicate with another device.

Example 38 includes all of the features of example 37, further comprising a bond finer disposed within the substrate, the bond finger having a length of 300 microns or less.

Example 39 includes all of the features of example 37, wherein the two or more vertically stacked dies comprise a topmost die and a bottom-most die, and at least one intermediate die disposed between the topmost die and the bottom-most die.

Example 40 includes all of the features of examples 37 or 39, wherein at least one wire is bonded to the topmost die and to the at least one intermediate die disposed immediately below the topmost die.

Example 41 includes all of the features of examples 37 or 39, wherein the at least one wire is bonded to the bottom-most die and to the at least one intermediate die immediately above the bottom-most die.

Example 42 includes all of the features of examples 37 or 39, wherein the at least one intermediate die comprises two or more intermediate dies, and wherein the two or more intermediate dies are coupled in series by a daisy chain arrangement of at least one wire bonded to each of the two or more intermediate dies.

Example 43 includes all of the features of examples 37 or 39, wherein at least one wire is bonded to the topmost die and to the bottom-most die.

Example 44 includes all of the features of any one of examples 37, 39 and 41, wherein at least one wire is bonded to the topmost die and to any one of at least one intermediate die.

Example 45 includes all of the features of any one of examples 37, 39 and 41, wherein at least one wire is bonded to the bottom-most die and to any one of the at least one intermediate die.

Example 46 includes all of the features of any one of examples 37, 39 through 45, wherein the two or more intermediate dies are adjacently coupled to each other by at least one wire bonded to two adjacent dies.

Example 47 includes all of the features of nay one of examples 37, 39 through 45, wherein the two or more intermediate dies are non-adjacently coupled to each other by at least one wire bonded to two non-adjacent intermediate dies.

Example 48 is an IC package comprising a substrate means for encapsulating at least one vertically integrated die stack, wherein the vertically integrated die stack comprises two or more vertically stacked dies having all the edges of the two or more dies aligned with respect to one another, and wherein at least two dies of the tow or more vertically stacked dies are coupled directly by at least one wire bonded to each die of the two or more vertically stacked dies.

Example 49 includes all of the features of example 48, further comprising a die attachment means for adhering adjacent dies of the two or more dies of the vertically integrated die stack, the die attachment means disposed between the adjacent dies of the two or more vertically stacked dies.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An IC package, comprising:
a substrate; and
two or more vertically stacked dies on the substrate and electrically coupled thereto, wherein the two or more vertically stacked dies each have a first surface over an opposing second surface and sidewalls extending orthogonally from a perimeter of the first surface to a perimeter of the second surface, wherein all the sidewalls of the two or more dies are aligned with respect to one another, such that all of the corresponding sidewalls of the two or more dies are substantially flush with each other,
wherein the two or more vertically stacked dies comprise a first die over a second die, wherein the second die is over the substrate, wherein the first die, the second die and the substrate are coupled directly to one another by a first wire having a first end that is directly attached to a bond pad on the first surface of the first die, and a second end that is directly attached to a first bond pad on the first surface of the second die wherein a second wire has a first end that is directly attached to a bond pad on the substrate, and a second end that is directly attached to the first bond pad or to a second bond pad on the first surface of the second die, wherein a die attachment film is between adjacent dies of the two or more vertically stacked dies, and wherein the second ends of the first wire and the second wire are embedded within a die attachment film over the first surface of the second die.

2. The IC package of claim 1, wherein the two or more vertically stacked dies comprise a first die and a second die, and at least one intermediate die between the first die and the second die, wherein the first end of the at least one wire is bonded to the bond pad on the first surface of the first die and the second end of the at least one wire is bonded to the bond pad on the first surface of the at least one intermediate die, and wherein the first die is over the at least one intermediate die.

3. The IC package of claim 1, wherein the two or more vertically stacked dies comprise a first die and a second die, and at least one intermediate die between the first die and the second die, wherein the first end of the at least one wire is bonded to the bond pad on the first surface of the second die and the second end of the at least one wire is bonded to the bond pad on the first surface of the at least one intermediate die, and wherein the second die is below the at least one intermediate die.

4. The IC package of claim 2, wherein the at least one intermediate die comprises one or more pairs of adjacent dies, wherein the dies of the one or more pairs of adjacent dies are coupled in series by a daisy chain arrangement of at least one wire bonded to each die in one or more pairs of adjacent dies of the two or more dies, and wherein the at least one wire has a first end bonded to the bond pad on the first surface of a first die of the one or more adjacent pairs, and a second end bonded to the bond pad on the first surface of a second die of the one or more adjacent pairs.

5. The IC package of claim 2, wherein the first end of the at least one wire is bonded to the bond pad on the first surface of the first die and the second end of the at least one wire is bonded to the bond pad on the first surface of the at least one intermediate die, and wherein a second wire of the at least one wire has a first end that is bonded to the bond pad on the first surface of the first die and a second end that is bonded to the bond pad on the first surface of the second die.

6. The IC package claim 4, wherein a second wire has a first end that is bonded to the bond pad on the first surface of the first die and a second end that is bonded to the bond pad on the first surface of any one of at least one intermediate dies.

7. The IC package of claim 6, wherein a third wire has a first end that is bonded to the bond pad on the first surface of the second die and a second end that is bonded to the bond pad on the first surface of any one of the at least one intermediate dies.

8. The IC package of claim 2, wherein the at least one intermediate die comprises two or more non-adjacent dies and coupled to one another by at least one wire having a first end bonded to the bond pad on the first surface of a first die of the two or more non-adjacent dies and a second end bonded to the bond pad on the first surface of a second die of the two or more non-adjacent dies.

9. A system, comprising:
a processor coupled to a memory, wherein the processor and/or the memory comprise:
at least one vertically integrated die stack disposed over an IC package substrate, the vertically integrated die stack comprising:
two or more vertically stacked dies on the IC package substrate and electrically coupled thereto, wherein the two or more vertically stacked dies each have a first surface over an opposing second surface and sidewalls extending orthogonally from a perimeter of the first surface to a perimeter of the second surface, wherein all the sidewalls of the two or more dies are aligned with respect to one another, such that all of the corresponding sidewalls of the two or more dies are substantially flush with each other, wherein the two or more vertically stacked dies comprise a first die over a second die, wherein the second die is over the substrate, wherein the first die, the second die and the substrate are coupled directly to one another by a first wire having a first end that is directly attached to a bond pad on the first surface of the first die, and a second end that is directly attached to a first bond pad on the first surface of the second die wherein a second wire has a first end that is directly attached to a bond pad on the substrate, and a second end that is directly attached to the first bond pad or to a second bond pad on the first surface of the second die, wherein a die attachment film is between adjacent dies of the two or more vertically stacked dies, and wherein the second ends of the first wire and the second wire are embedded within a die attachment film over the first surface of the second die, wherein the die attachment film is to liquefy at or above a glass transition temperature of the die attachment film; and
a wireless interface to allow the processor to communicate with another device.

10. The system of claim 9, wherein the two or more vertically stacked dies comprise a first die and a second die, and at least one intermediate die between the first die and the second die, wherein the first end of the at least one wire is bonded to the bond pad on the first surface of the first die and the second end of the at least one wire is bonded to the bond pad on the first surface of the at least one intermediate die, and wherein the first die is over the at least one intermediate die.

11. The system of claim 9, wherein:
the two or more vertically stacked dies are non-adjacent and coupled by the at least one wire, wherein the at least one wire has a first end bonded to the bond pad on the first surface of a first die of the two or more vertically stacked dies, and a second end bonded to the bond pad on the first surface of a second die of the two or more non-adjacent vertically stacked dies; or
the two or more vertically stacked dies are adjacent and are coupled by the at least one wire, and wherein the at least one wire has a first end bonded to the bond pad on the first surface of a first die of the two or more vertically stacked dies, and a second end bonded to the bond pad on the first surface of a second die of the two or more adjacent vertically stacked dies.

* * * * *